Dec. 6, 1966 N. L. KAHN 3,289,852

FLEXIBLE PRINTED CIRCUIT CHASSIS

Filed April 7, 1965 2 Sheets-Sheet 1

INVENTOR
NATHANIEL L. KAHN
BY
OSTROLENK, FABER, GERB & SOFFEN
ATTORNEYS

FLEXIBLE PRINTED CIRCUIT CHASSIS

Filed April 7, 1965 2 Sheets-Sheet 2

INVENTOR
NATHANIEL L. KAHN
BY
OSTROLENK, FABER, GERB & SOFFEN
ATTORNEYS 3,289,852
FLEXIBLE PRINTED CIRCUIT CHASSIS
Nathaniel L. Kahn, Glen Rock, N.J., assignor, by mesne assignments, to Sangamo Electric Company, Springfield, Ill., a corporation of Delaware
Filed Apr. 7, 1965, Ser. No. 446,177
10 Claims. (Cl. 211—13)

The instant invention relates to chassis for electrical circuits and more particularly, to a flexible printed circuit chassis comprised of a novel module for receiving electrically circuitry prepared in the form of printed circuit boards.

Present day electronic systems and equipment typically employ solid state circuitry in the form of printed circuit boards having solid state components normally electrically connected thereto by a dip solder process. In large scale electronic systems and equipment, it is typical to find the same identical type of circuit or circuits being used over and over again within this system. It has become standard practice to provide standard printed circuit modules for circuits falling into this category. Some typical modules may, for example, be a flip-flop stage for use as a counter or shift register, a section of logical gating circuitry for use in computer systems, a one or two stage amplifier circuit, an audio receiver circuit, an audio transmitter circuit, and an oscillator circuit, to name just a few. Printed circuit boards of this type are normally inserted into housings having racks specifically designed for receiving the printed circuit boards with electrical connections between and among the printed circuit boards forming the electronic system or equipment being made by suitable plug in means usually located at or near the rear of the rack within the housing with wires or cables running between the plug in members provided at the rear of the rack for making the appropriate electrical connections.

In many instances, racks of this nature are manufactured in accordance with standardized dimensions. In many applications, not all of the locations provided for receiving printed circuit boards are needed or used, and hence a portion of the cost of such racks for receiving printed circuit boards represents wasted or unneeded space.

In other instances, electronic systems and equipment are specifically designed so as to be adaptable to easily and readily receive additional printed circuit modules for increasing the capacity of the electronic system due to projected forecasts that such increased capacity will be needed in such a system or piece of equipment. While the housings or cabinets are preferably selected so as to be large enough to accommodate the additional printed circuit boards which are expected to be needed as the system demands are increased, in accordance with present day technology, the racks for receiving such printed circuit boards are normally purchased at the time that the piece of equipment or system is constructed.

The instant invention contemplates the use of a novel modular chassis member which is designed to receive and position a printed circuit board and which may be joined with as many additional modular chassis members as are needed at the time the system is being constructed. If at a later time it occurs that additional printed circuits are required for the piece of equipment or system, these modules may be simply and readily added to the modules present in the original system. The overall design presents a simple, rigid and neat appearance and is adaptable for use with any printed circuit board employing solid state components.

The instant invention is comprised of a hollow elongated housing having a substantially rectangular configuration. The four outer surfaces of each module are provided with an elongated undercut channel running the entire length of the module. Two interior corners of the modular housing are provided with grooves which run the entire length of the module and which are adapted to receive the opposite marginal edges of a printed circuit board. The remaining interior diagonal corners of the modular member are provided with substantially circular shaped grooves which may be employed to receive fastening members such as self-tapping screw members for securing the modular member to the face or front plate of the cabinet. They may also receive the self-tapping screws which fasten the plate which mounts an electrical connector for the printed circuit board.

In order to join adjacent modular housings to one another this may be simply and readily done through the use of a short connecting member having a cross-sectional configuration adapted to be received by the double undercut channels provided along the faces of each module. The cross-sectional configuration of the connecting member is such as to make a forced fit with the double undercut channel so as to assure rigid engagement therebetween.

For mounting such modular members into a housing or cabinet, only a small number of the modular members need be secured to the cross-bracing members of the housing whereas the remaining modular members may be firmly mounted within the cabinet simply by connection thereto with adjacent modular members.

The modular members may be simply and readily produced through an extrusion process and one preferred material which lends itself readily to such an extrusion process is aluminum. Likewise, the connecting members may be formed through an extrusion process and may be made of either a plastic material or a relatively soft metallic material so as to permit the forced fitting operation to be performed in a relatively simple manner and yet to provide rigid engagement between and among adjacent modules.

The strutted modules may be made of any desired length and once having been formed may be cut to any shorter length if so desired. The extruded connecting members may preferably be initially formed as elongated members which members may subsequently be cut to size prior to use thereof. Through the use of the module provided herein it becomes quite simple to add additional printed circuit boards to the piece of electrical equipment or system only as they become needed with the only proviso being that adequate room be allotted within the housing or cabinet to accommodate additional printed circuit modules.

It is, therefore, one object of the instant invention to provide a novel module for use in mounting printed circuit boards within a housing rack or cabinet.

Another object of the instant invention is to provide a novel printed circuit module for use in mounting printed circuit boards within housings, cabinets, racks and the like wherein each modular housing is provided with novel double undercut channels cooperating with connecting members of a similar configuration for use in securing the housing modules to one another.

Another object of the instant invention is to provide a novel modular housing for use in mounting printed circuit boards within cabinets, racks and the like wherein the modular housing may be simply and readily formed through an extrusion process.

These and other objects of the instant invention will become apparent when reading the accompanying description and drawings in which:

FIGURE 2 shows a perspective view of a connecting member for use with the modular housing of FIGURE 1.

Figures 1, 3:
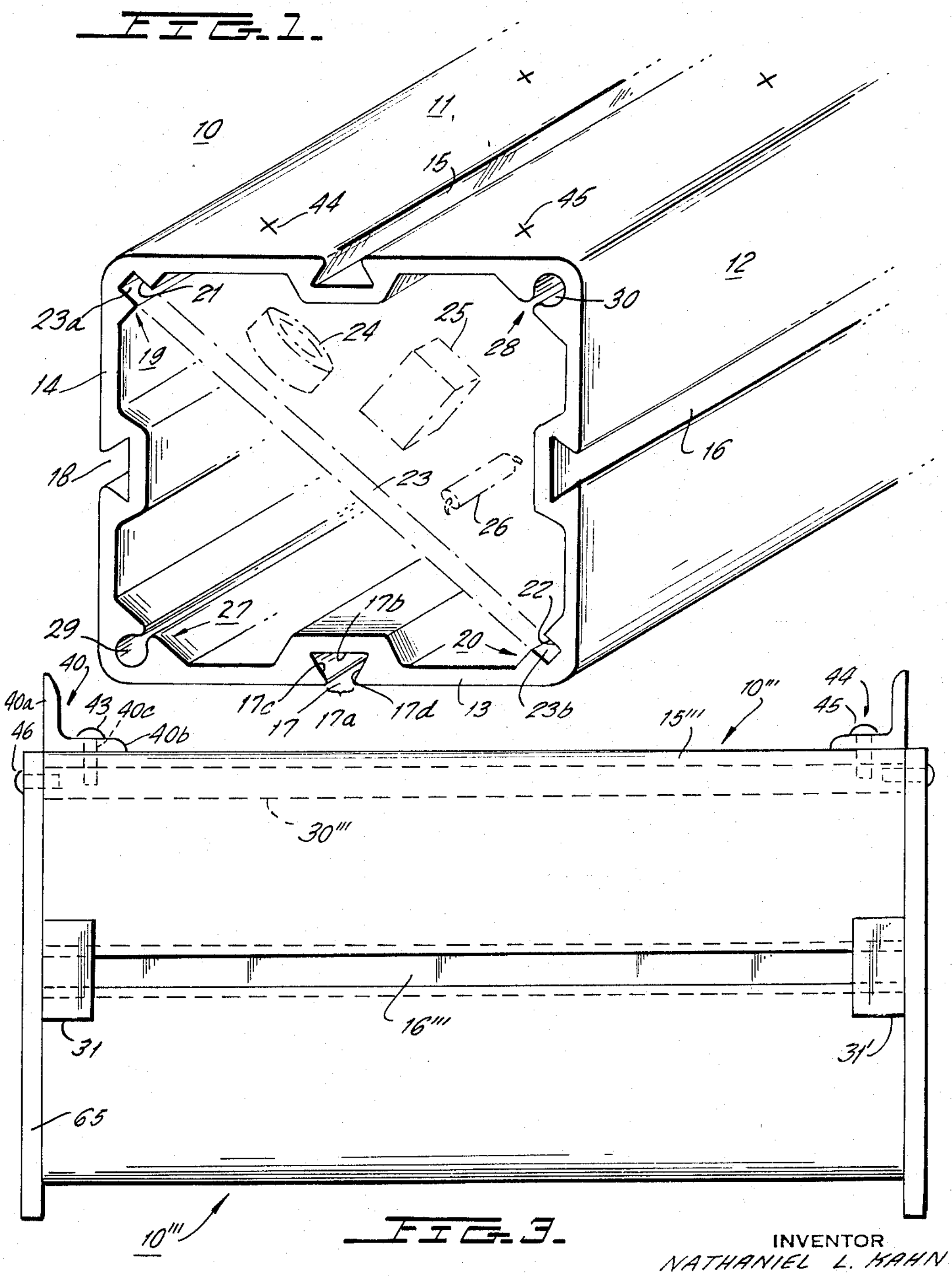
FIGURE 1 is a perspective view showing a housing module designed in accordance with the principles of the instant invention.
FIGURE 3 shows a side view of the modular housing of FIGURE 1.
Figure 8:
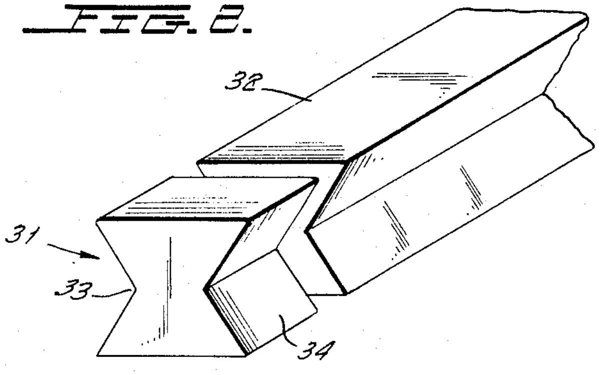

Referring now to the drawings, FIGURE 1 shows a perspective view of a modular housing 10 designed in accordance with the principles of the instant invention. The housing 10 has a substantially rectangular cross-sectional configuration having four sides 11–14, respectively. Each of the exterior sides 11–14 are provided with an associated elongated channel 15–18, respectively. Since each of the channels are substantially identical to one another, only one of the channels, namely channel 17, will be described in detail, it being understood that the remaining channels are substantially identical in design and function. Channel 17 has a mouth or opening **17*a* substantially narrower than the base 17*b* of channel 17. Two undercut walls 17*c* and 17*d* are located between the ends of the base 17*b* and opening 17*a***.

The interior diagonal corners 19 and 20 of modular housing 10 are provided with grooves 21 and 22, respectively, which run the entire length of module 10 and are adapted to receive the marginal edges **23*a* and 23*b* of printed circuit board 23, which printed circuit board has a plurality of components such as, for example, the components 24–26** physically and electrically connected thereto. Typical components which are mounted to printed circuit boards are vacuum tubes, transistors, diodes, capacitors, resistors, potentiometers, transformers, magnetic cords, lamps, and the like.

The remaining diagonal interior corners 27 and 28 of modular housing 10 are provided with substantially circular shaped grooves 29 and 30, respectively, which grooves run the entire length of the housing 10 and which are adapted to receive fastening members such as, for example, self-tapping screws for mounting face plates thereto in a manner to be more fully described.

The modular housing 10 may preferably be formed through an extrusion process and may be made of any desired length. For example, if desired the modular housing may be made of a length which is much greater than that which would be expected to be used with the modular housing being cut to size at the time of use. While aluminum extruded modular housings are one preferable form of the instant invention, it should be understood that the modular housing 10 may be formed of any other suitable material and through any other method without departing from the spirit and concepts of the instant invention.

FIGURE 2 is a perspective view of the connecting member 31 which is designed for use with the modular housing 10. The connecting member is preferably formed of a soft metallic material or of a plastic material through an extrusion process with the connecting member being formed initially as an elongated rod such as the rod 32. At the time of use of the connecting member, each individual connecting member may be cut to size. Each connecting member 31 is a substantially solid member having V-shaped grooves 33 and 34 along opposite sides. The configuration of the connecting member 31 is such that the upper half (or lower half as the case may be) has a configuration which is quite similar to the double undercut groove or channel provided along the exterior surface of each of the outer walls 11–14, respectively.

Figure 5:
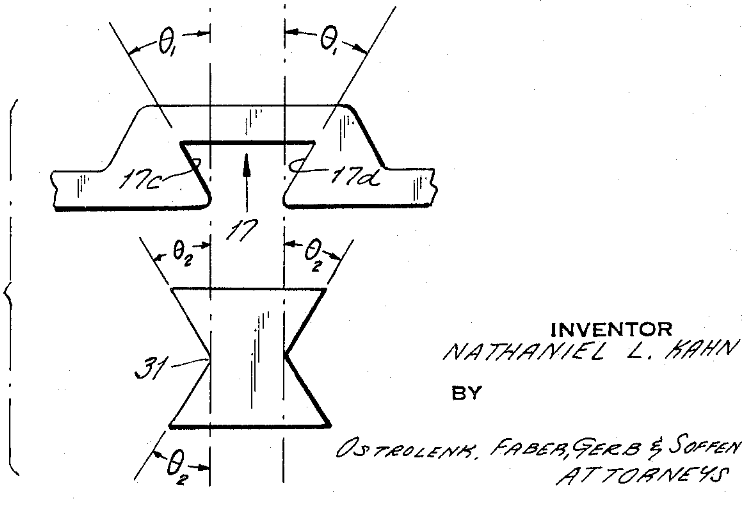
FIGURE 5 is a view of one housing channel and one connector.

Considering the detailed view of one channel provided in the modular housing 10 and one connecting member 31, it will be noted that the undercut walls **17*c* and 17*d* of the channel 17 shown in FIGURE 5 both form an angle $\theta_1$ with a line extending vertically upward from each side of the opening 17*a*. Considering the connecting member 31, it will be noted that each surface of the vertical grooves 33 and 34 forms an angle $\theta_2$ with a line extending vertically upward (or downward as the case may be) from the bottom-most point of the V-shaped groove. The design of the groove and connecting member is such that the angle $\theta_2$ is somewhat greater than the angle $\theta_1$. Thus it can be seen that the connecting member 31 when inserted into the double undercut channel 17 will not be permitted to slide freely within channel 17, but actually requires an instrument such as a hammer, for example, be used to force fit the connecting member 31 into the groove or channel 17**.

Figure 4:
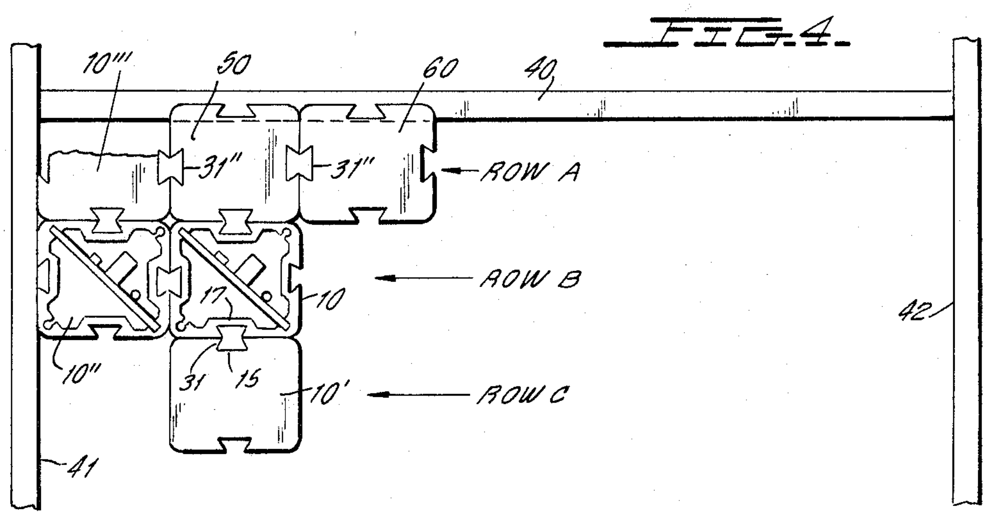
FIGURE 4 shows a front elevational view of the manner in which modular housings of the type shown in FIGURE 1 may be mounted to an equipment rack.

Two adjacent modular members such as, for example, the modular members 10 and 10′ shown in FIGURE 4, may easily and readily be joined to one another simply by force fitting a connecting member 31 into the adjacent channels 15′ and 17. This may simply and readily be done by aligning the front edges of the modular members 10 and 10′ shown in FIGURE 4 so that their front edges lie substantially within a vertically aligned plane and then force fitting the connecting member 31 into the grooves 17 and 15′. The remaining modular members 10‴ and so forth may be joined in a like manner. It can be seen from FIGURE 4 that only a small number of the modular members need be directly mounted to a horizontal bracing member such as, for example, the bracing member 40 of a cabinet or rack or the like, which bracing member is secured to the upright members 41 and 42 in any suitable manner.

The manner in which a modular member such as, for example, the modular housing 10‴ is connected to the horizontal bracing member 40, can best be seen in FIGURE 3. As shown therein, the horizontal bracing member 40 is preferably a right angle arm with the vertically aligned portion **40*a* being connected to one of the uprights 41 or 42 by any suitable fastening means. The horizontally aligned arm 40*b* may be provided with a suitable aperture 40*c* for receiving fastening means 43 which may, for example, be a self-tapping screw. The fastening member 43 is then threaded into the top side face 15‴ of the modular housing 10‴ substantially at the locations 44 and 45 shown in FIGURE 1. It can be seen from a consideration of FIGURES 1 and 3 that the fastening member 43 may be relatively short and as such will not interfere in any way with the components 24 through 26 mounted to printed circuit board 23**.

The rear end of modular housing 10‴ is preferably secured to a second horizontal bracing member 44 by the fastening means 45 which is secured in the same manner as previously described. Again it should be noted that the length of the fastening member 45 is so chosen as to avoid any interference or engagement with the printed circuit board 23 or any of the components secured thereto. The rear of the rack or structure to which the modular housings are mounted may be suitably provided with connecting means for electrically connecting the printed circuit board to other printed circuit boards within the piece of electrical equipment. There are a large variety of means presently available through which inter-connections between and among printed circuit boards may be made and any description of such assemblies has been omitted herein for purposess of clarity, it being understood that the desired means for making such connections is dependent only upon the needs of the user.

FIGURE 3 shows the location of two connecting members 31 and 31′ located near the front and rear ends thereof and being force fitted into the double undercut channel 16‴. Connecting members are preferably force fitted into the double undercut channels of adjacent modular members in order to provide adequate support for all modular housing so mounted.

It can be seen from a consideration of FIGURE 4 that only the top row, namely, row A of modular housing need be fastened to the horizontal bracing member 40 whereas the remaining modular housings, namely, the modular housings located in rows B and C, for example, are secured to adjacent modular housings and need not be fastened to any of the bracing members of the rack or cabinet. If desired, less than all of the modular housings located in row A as shown in FIGURE 4 may be fastened to the horizontal bracing member 40 while the remaining modular housings may be connected to the housings which are secured to the horizontal bracing member 40 by means of the connecting members 31 without any need for the use of the fastening members 43 and 45 as shown in FIGURE 3. For example, the modular housings 10''' in 60 of row A may be fastened to horizontal bracing member 40 through the use of suitable fastening means while the modular housing 50 may be secured through the use of the connecting members 31'' without any need for connecting housing 50 to the horizontal bracing members 40 and 44 since the modular housings 10''' and 60 will provide adequate and rigid support for modular housing 50 through the use of the connecting members 31''. The cooperating double undercut channels and connecting members provide strength of a sufficient degree so as to permit every third or every fourth or even every fifth modular housing located within row A to be fastened to the horizontal bracing members 40 and 44 with the remaining modular housings being connected to one another through the use of the connecting members 31'' (for example) thereby avoiding the need for the fastening members 43 and 44 for mounting these intermediate modular housings.

The same concept may be employed in extending the modular housings vertically downward so that additional rows such as, for example, rows D, E, F and so forth may be secured to the already existing modular housings simply through the use of connecting members 31''.

The modular housings may be further secured against the possibility of any movement in the horizontal direction by securement of each modular housing or less than all of the modular housings to a front plate. Considering FIG. 3, for example, there is shown a vertically aligned face plate 65. The face plate is shown connected to the modular housing 10''' by means of a fastening member 66 which may, for example, be a self-tapping screw. The fastening member 66 is threaded into the circular-shape groove 30''' of the modular housing 10''' and serves a dual function of acting as a suitable means for mounting the face plate 65 to the structure as well as preventing the modular housing 10''' from experiencing any movement along its longitudinal axis (in the case where it is not connected to the horizontal bracing members 40 and 44 by fastening members 43 and 45) as well as acting as a means for mounting the face plate 65 to the racks supporting the printed circuit modules.

It can be seen from the foregoing that the instant invention provides a novel modular housing for use in mounting printed circuit modules within a rack or cabinet wherein additional printed circuit modules and hence, modular housings may be readily and simply added through the use of a force fitted connecting member cooperating with double undercut grooves provided in the modular housing for rigidly positioning and securing all of the modular housings to the electrical system supporting structure.

Although there has been described a preferred embodiment of this novel invention, many variations and modifications will now be apparent to those skilled in the art. Therefore, this invention is to be limited, not by the specific disclosure herein, but only by the appending claims.

What is claimed is:

1. Modular means for housing printed circuit modules and the like comprising;
- a hollow, substantially rectangular shaped elongated housing;
- at least one outer face of said housing having an elongated groove substantially parallel to the longitudinal axis of said housing;
- said groove having a double undercut cross-sectional configuration;
- opposite interior corners of said housing each being provided with a substantially U-shaped groove for receiving the opposing marginal edges of a printed circuit assembly;
- at least one of the remaining interior corners being provided with an elongated substantially circular shaped groove for threadably engaging a fastened member;
- means frictionally engaged by said groove for joining said housing to adjacent supporting structure.

2. The device of claim 1 wherein said joining means is a substantially short solid member having first and second substantially planar opposing faces, and the remaining sides having a substantially V-shaped configuration.

3. Modular means for housing printed circuit modules and the like comprising;
- a hollow, substantially rectangular shaped elongated housing;
- each outer face of said housing having an elongated groove substantially parallel to the longitudinal axis of said housing;
- said groove having a double undercut cross-sectional configuration;
- opposite interior corners of said housing each being provided with a substantially U-shaped groove for receiving the opposing marginal edges of a printed circuit assembly;
- at least one of the remaining interior corners being provided with an elongated substantially circular shaped groove for threadably engaging a fastened member;
- means frictionally engaged by said groove for joining said housing to adjacent supporting structure.

4. The device of claim 3 wherein said joining means is a substantially short solid member having first and second substantially planar opposing faces, and the remaining sides having a substantially V-shaped configuration.

5. The device of claim 2 wherein the side walls of said double undercut grooves are inclined at first angle;
- the faces of said V-shaped grooves in said joining means being inclined at an angle different from said first angle to insure a force-fit between said housing grooves and said joining means.

6. Modular means for housing electrical circuits employing printed circuit boards comprising;
- a plurality of housings of the type described in claim 2 being arranged substantially in a row;
- adjacent faces of said housing being secured by said joining means; substantially half of said joining means being force fitted into the associated groove of one housing and the remaining half of said joining means being force fitted into the associated groove of the adjacent housing.

7. Modular means for housing electrical circuits employing printed circuit boards comprising;
- a plurality of housings of the type described in claim 2 being arranged substantially in a column;
- adjacent faces of said housings being secured by said joining means; substantially half of said joining means being force fitted into the associated groove of one housing and the remaining half of said joining means being force fitted into the associated groove of the adjacent housing.

8. Modular means for housing electrical circuits employing printed circuit boards comprising;
- a plurality of housings of the type described in claim 2 being arranged substantially in rows and columns;
- adjacent faces of said housings being secured by said joining means; substantially half of said joining means being force fitted into the associated groove of one housing and the remaining half of said joining means being force fitted into the associated groove of the adjacent housing.

9. Apparatus for housing an electrical circuit employing a plurality of printed circuit boards comprising;

a plurality of housings of the type described in claim 8;

a supporting structure for mounting said housings;

selected ones of said housings in one of said rows being fastened to said supporting structure by suitable threaded fastening means with the remaining housings being supported by said joining means.

10. The apparatus of claim 9 further comprising a faceplate mounted across one face of said housings; fastening means threadedly engaging said interior substantially circular shaped groove for securing said faceplate to said housings and for maintaining said housings substantially in alignment.

References Cited by the Examiner

UNITED STATES PATENTS

| | | | |
|---|---|---|---|
| 2,917,188 | 12/1959 | Menin | 211—177 |
| 2,944,678 | 7/1960 | Grantham | 211—177 |

CLAUDE A. LE ROY, *Primary Examiner*.